United States Patent [19]
Manlove et al.

[11] Patent Number: 5,467,034
[45] Date of Patent: Nov. 14, 1995

[54] OXYGEN SENSOR INTERFACE CIRCUIT WITH OPTIMIZED GAIN CHARACTERISTICS

[75] Inventors: Gregory J. Manlove; Donald A. Hitko, both of Kokomo, Ind.

[73] Assignee: Delco Electronics Corporation, Kokomo, Ind.

[21] Appl. No.: 349,573

[22] Filed: Dec. 5, 1994

[51] Int. Cl.$^6$ ............................... H03K 5/22; G06G 7/18
[52] U.S. Cl. .............................. 327/63; 327/74; 327/337; 327/362
[58] Field of Search ................................. 327/63, 65, 74, 327/77, 337, 334, 554, 403, 407, 404, 408, 69, 362, 561; 330/9, 51

[56] References Cited

U.S. PATENT DOCUMENTS

| | | | |
|---|---|---|---|
| 3,906,247 | 9/1975 | Heffner | 327/63 |
| 4,093,876 | 6/1978 | Henein et al. | 327/77 |
| 4,560,890 | 12/1985 | Masuda et al. | 327/63 |
| 5,381,053 | 1/1995 | Yasuda | 327/77 |

OTHER PUBLICATIONS

National Semiconductor—Linear Databook 3—1988 Edition pp. 5–190.

*Primary Examiner*—Timothy P. Callahan
*Assistant Examiner*—Toan Tran
*Attorney, Agent, or Firm*—Jimmy L. Funke

[57] ABSTRACT

A sensor interface circuit and method are provided which realizes common mode rejection, compensates for external input impedance and internal loads and achieves a desired transfer response. The interface circuit is particularly useful for amplifying and conditioning signals generated by an oxygen sensor on an automotive vehicle. The sensor interface circuit has first and second inputs for receiving input voltages from a sensor which are joined together to provide a differential voltage representative of the voltage potential between the first and second inputs. RF filtering circuitry is coupled to both inputs. An amplifier having a gain and a first input receives a differential voltage and has an output coupled to a grounded switch for providing an output signal referenced to reference ground. A supply voltage is applied across the inputs and a current is supplied to one of the inputs. A comparator compares a voltage potential on the selected one of the first and second inputs and provides an output which controls a switch for switching the interface circuit output between the amplifier output and a predetermined voltage output. The circuit is particularly useful for automotive applications for interfacing with an oxygen sensor to compensate for the load effects associated with the RF filtering circuitry where voltage excursions may occur between the common mode sensor ground and reference ground.

12 Claims, 3 Drawing Sheets

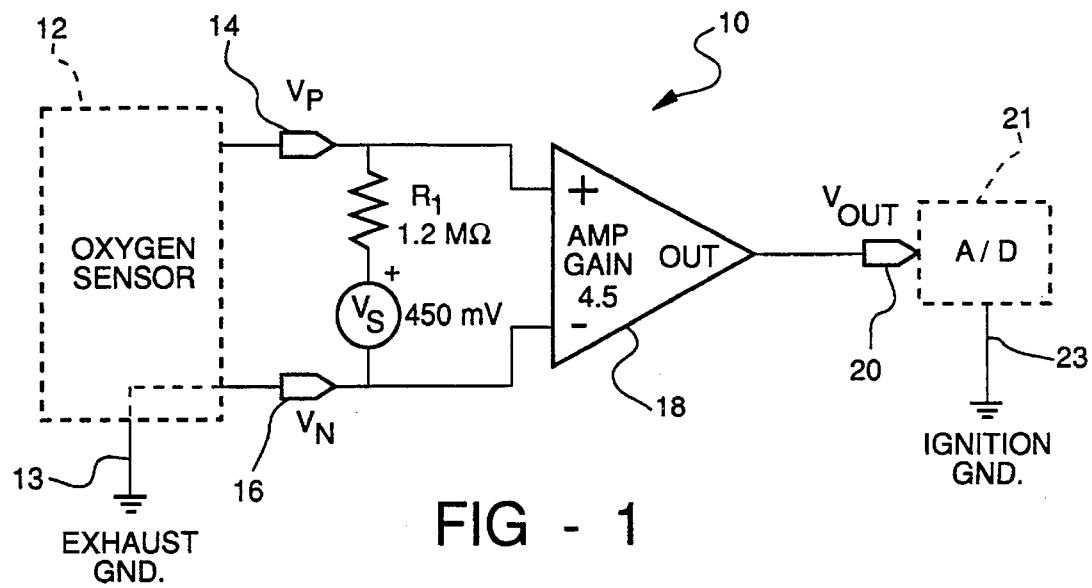
FIG - 1
FIG - 3
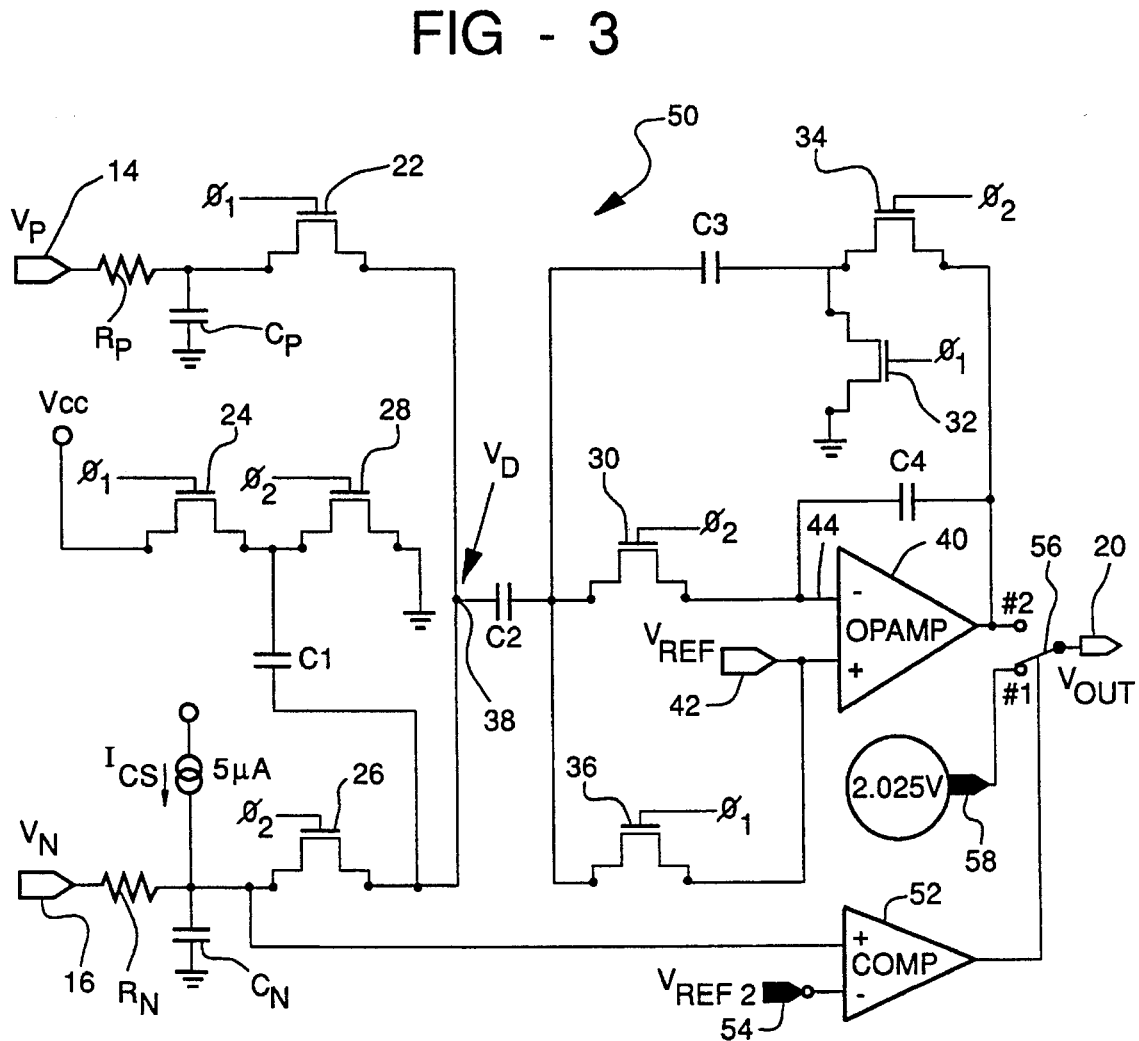

OXYGEN SENSOR INTERFACE CIRCUIT WITH OPTIMIZED GAIN CHARACTERISTICS

BACKGROUND OF THE INVENTION

1. Technical Field

This invention relates generally to a sensor interface circuit and, more particularly, to a circuit and method for processing sensor signals output from an oxygen sensor such as that employed with an automobile while compensating for external input impedances and internal loads.

2. Discussion

A sensor interface circuit is generally employed to interface the analog outputs of a sensor with a processing device. This type of interface circuit is typically used to sufficiently amplify and condition the sensor signal as required for further processing. In automotive applications, an oxygen sensor is typically mounted in the exhaust system of an automotive engine, while an oxygen sensor interface circuit is usually mounted in an engine control module, powertrain control module or in combination with some other processing device. In accordance with well known automotive applications, the oxygen sensor signals are commonly used to maintain a stoichiometric air-to-fuel ratio for maintaining proper operation of the catalytic converter.

Since the oxygen sensor is typically located in the engine compartment and is separate from the interface circuit, the interface circuit generally must be capable of rejecting common mode signals. This is because input common mode voltage excursions may be as great as plus or minus two volts with respect to the ground employed by the interface circuit and processing circuitry coupled thereto. Also, in addition to providing a sufficiently amplified signal that may be properly processed, the interface circuit must also be capable of detecting various error conditions such as broken or open wires leading to the sensor.

Conventional oxygen sensor interface circuits have generally included an amplifier equipped with a fixed gain which receives an analog differential voltage across a pair of oxygen sensor output lines. The conventional circuit also includes a small voltage source for generating a known amplifier output which is indicative of either an open lead condition or an extremely cold sensor. One example of a commercially available sensor interface circuit is the sensor interface amplifier Model No. LM1964 which is manufactured by National Semiconductor. Another sensor interface circuit is disclosed in U.S. patent application Ser. No. 08/235,741, filed Apr. 29, 1994, titled "Oxygen Sensor Interface Circuit with Simplified Amplifier Requirements," and assigned to the assignee of the present invention. The above prior art examples are precision differential amplifiers designed for use in the automotive environment in which a sensor is typically grounded at the engine block while the sensor interface amplifier is grounded at chassis potential. The above examples further employ an external capacitor to filter out high frequency transients and typically exhibits an impedance of about 1 MΩ.

For most practical applications, sensor interface circuits generally require input filtering to filter out unwanted noise, especially for oxygen sensors which are commonly located in close proximity to the engine of a vehicle. In the past, the input filtering has been accomplished by connecting a resistor-capacitor (RC) circuit to each input terminal. A typical RC filter circuit has a capacitor coupled to ground and a resistor connected in series between the sensor output line and the amplifier. While such an input filtering configuration operates to minimize high frequency noise, the RC filter circuit also introduces an AC impedance to ground on both the positive and negative inputs which can cause problems, especially when either the positive or negative leads are opened. In addition, gain attenuation problems are further introduced into the circuit. The gain attenuation problems are often caused by the RC filter circuit resistors reducing the differential voltage applied to the amplifier. This generally results in an error and reduces gain. Errors of this kind are undesirable, especially for current and future engine and powertrain control module (ECM and PCM) applications which generally require accurate sensing information.

Prior attempts have been made to correct or otherwise compensate for the above cited problems. To account for an open circuit, a current source has been added along with a comparator for detecting if the input voltage deviates from a common mode range. However, in accordance with conventional approaches, this has generally resulted in the presence of an offset at the output. In practice, a constant offset has been established at the output in excess of twenty millivolts. This amount of offset is excessive for most modern and future engine control modules and powertrain control modules.

Additionally, conventional sensor interface circuits such as that mentioned in the above example generally employ bipolar transistor and resistor circuitry. However, such conventional interface circuits tend to have a number of problems associated therewith. First, matching characteristics of commonly employed resistors are generally not accurate enough to easily meet the current and future needs of automotive oxygen sensor applications. These inaccuracies typically require that both the gain and input referred voltage be adjusted on most every part that is manufactured. This can lead to an expensive and time consuming process. Second, the input impedance of the interface circuit is usually a function of an internal resistor which generally has variations associated therewith due to process and temperature conditions. Variations in the input impedance can adversely affect the transfer response of a given system. Also, many conventional approaches generally employ operational amplifiers which are connected to a common mode ground. This has the effect of limiting the amplifier operation and complicating the amplifier requirements.

It is therefore desirable to provide for an interface circuit that interfaces with sensor output signals to process the signals and realize a desired transfer curve while compensating for external impedances and internal loads.

It is a further object of the present invention to provide for an oxygen sensor interface circuit which employs accurate matching characteristics which generally do not vary or otherwise adversely affect the transfer response of a given system.

It is another object of the present invention to provide for an oxygen sensor interface circuit which employs a switched capacitor circuit topology to achieve a desired transfer response and allows for external impedance matching.

It is yet another object of the present invention to provide an oxygen sensor interface circuit and method that employs input filtering with RC circuitry and provides compensation for added series resistance to minimize gain attenuation problems and reduce problems associated with an AC impedance to ground.

SUMMARY OF THE INVENTION

In accordance with the teachings of the present invention, a sensor interface circuit and method are provided for processing input sensor signals to produce a desired transfer response while compensating for external input impedances and internal loads such as that associated with the addition of input RF filtering circuitry. The interface circuit includes first and second inputs for receiving an input voltage from a sensor. The first and second inputs each have RC filter circuitry coupled to ground. The first and second inputs are joined together to provide a differential voltage that is representative of the voltage potential between the first and second inputs. An amplifier is provided having an input for receiving the differential voltage and an output for generating an amplified output signal. A predetermined current is supplied to a selected one of the first and second inputs. Also, a voltage signal is supplied across the first and second inputs. A comparator compares a voltage potential on the selected one of said first and second inputs with a predetermined reference voltage. A switch is coupled to an interface output and provides for selectively switching between the output of the amplifier and a predetermined voltage output in response to the comparator output. The present invention advantageously compensates for input impedances. This is accomplished by selecting the voltage supplied across the first and second inputs so as to eliminate any voltage offset and selecting the gain of the amplifier and input resistance so as to achieve a desired overall gain. The circuit is particularly useful for automotive applications, especially for interfacing with an oxygen sensor.

BRIEF DESCRIPTION OF THE DRAWINGS

Other objects and advantages of the present invention will become apparent to those skilled in the art upon reading the following detailed description and upon reference to the drawings in which:

FIG. 1 is a schematic diagram of an oxygen sensor interface circuit coupled between an oxygen sensor and an analog-to-digital converter;

FIG. 3 is a circuit diagram of the oxygen sensor interface circuit of the present invention implemented using switched capacitor circuitry according to a preferred embodiment.

DETAILED DESCRIPTION OF THE PREFERRED EMBODIMENT

Figure 2:
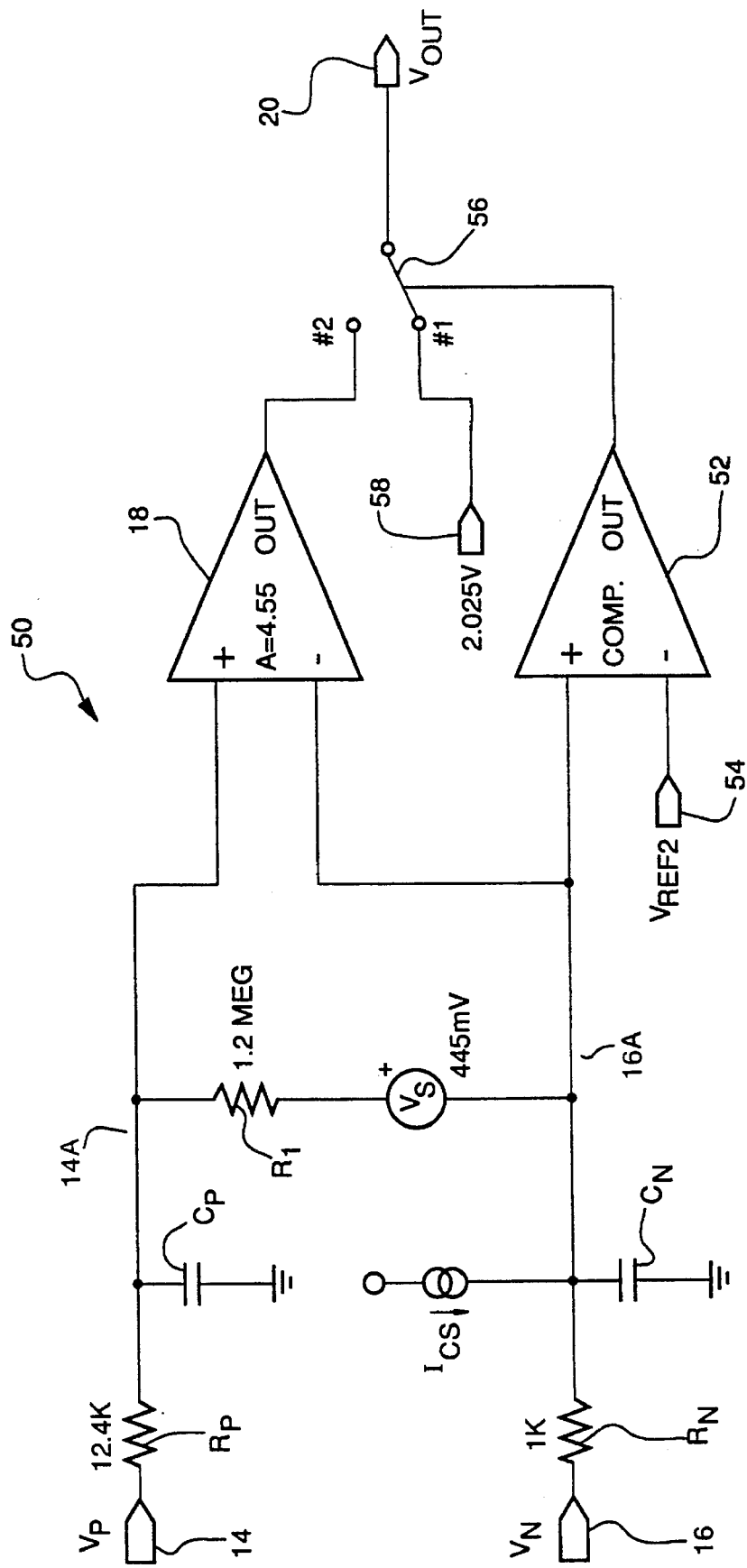
FIG. 2 is a circuit diagram of an improved oxygen sensor interface circuit according to the present invention.

Turning to FIG. 1, a sensor interface circuit 10 is schematically shown connected to an oxygen sensor 12 in a manner generally required for current automotive applications. The sensor interface circuit 10 is used to interface an oxygen sensor 12 with a processing device such as an analog-to-digital converter 21 which in turn typically feeds an engine control module or powertrain control module (not shown). In doing so, interface circuit 10 provides signal amplification and signal conditioning as required by the particular processing operation. The interface circuit 10 is described in connection with an oxygen sensor interface circuit which is particularly useful for automotive applications. However, it should be appreciated that circuit 10 may also be used to interface with other types of circuits and sensors.

The interface circuit 10 includes a pair of input terminals 14 and 16 for receiving a differential voltage output from the oxygen sensor 12. An amplifier stage 18 is included for producing a predetermined fixed gain. A fixed gain of 4.5 is produced according to one example described herein. The amplifier stage 18 is shown with a positive input connected to the first input terminal 14 and therefore receives a positive portion $V_P$ of the differential voltage. Amplification gain stage 18 is further shown with a negative input coupled to the second input terminal 16 for receiving a reference or negative portion $V_N$ of the differential voltage. The negative portion $V_N$ of the differential voltage is preferably a ground that is employed by sensor 12. In automotive applications, the ground employed by oxygen sensor 12 is commonly connected to the vehicle exhaust system. The exhaust system ground therefore provides the common mode ground for sensor 12 via line 13 to which signal $V_P$ is referenced with. In response, amplification gain stage 18 generates an analog voltage output $V_{OUT}$ via an output terminal 20.

The oxygen sensor interface circuit 10 further includes a constant voltage signal $V_S$ supplied in series with a resistor $R_1$ between the input terminals 14 and 16. According to one example, voltage signal $V_S$ has a direct current (DC) voltage of 450 mV, while resistor $R_1$ has a preferred resistance of about 1.2 Mohms. During normal operation, the voltage signal $V_S$ has a negligible effect on the sensor output signal applied across input terminals 14 and 16, and therefore has a negligible effect on the amplifier output $V_{OUT}$. Under normal operating conditions, the oxygen sensor 12 is generally sufficiently heated so that the effective series resistance is known to be about 100 kohms or less, for example. However, should the sensor leads connected to the input terminals 14 and 16 become an open-circuit, the voltage signal $V_S$ will become the dominant input signal to amplifier stage 18. Likewise, immediately following a cold engine start, when the effective resistance of sensor 12 may be on the order of several megaohms, the voltage signal $V_S$ then also becomes the dominant input signal to amplifier stage 18. Under these circumstances, a direct current (DC) output voltage of 2.025 volts is produced as the amplifier output voltage $V_{OUT}$. When this 2.025 volt output voltage $V_{OUT}$ is sensed for a predetermined period of time, a central processing unit (not shown) detects the presence of a cold sensor or open lead condition.

The oxygen sensor 12 is commonly mounted within the exhaust system of an automobile engine and is typically grounded to the exhaust system ground as shown by ground line 13. Quite often, the exhaust ground is not the same as the ignition ground or engine ground that is commonly employed by the analog-to-digital converter 21 via ground line 23 and also used by other interfaced processing devices that are coupled to the converter 21. However, it is not uncommon to have voltage excursions between the exhaust ground and ignition ground. According to conventional approaches, the AC reference to the amplifier gain stage 18 is generally set equal to the engine ground. This results in serious constraints on the amplifier gain stage 18 for conventional circuits.

Referring now to FIG. 2, an interface circuit 50 is illustrated therein in accordance with the present invention. The interface circuit 50 includes RC input filters coupled to both input feed lines 14 and 16. As previously mentioned, most practical systems require input filtering to eliminate the undesirable effects caused by noise sources. This is especially true for oxygen sensors mounted in an automotive vehicle where it is not uncommon for the oxygen sensor to be located in close proximity to the engine and therefore subjected to a number of noise sources.

More specifically, the interface circuit 50 has an RC filter network connected to each of input lines 14 and 16. With regard to input line 14, a first resistor $R_P$ is connected in series with input line 14. A capacitor $C_P$ is connected between input line 14A and ground. Together, resistor $R_P$ and capacitor $C_P$ form an RC filter network to filter noise from input line 14. With regard to input line 16, a second resistor $R_N$ is connected in series with input line 16. A capacitor $C_N$ is connected between input line 16 and ground. Together, resistor $R_N$ and capacitor $C_N$ likewise form an RC filter network to filter noise from input line 16.

The RC filtering networks described above provide input filtering so as to minimize unwanted high frequency noise. However, the RC filter networks introduce an AC impedance to ground on both the positive and negative inputs 14 and 16 due to the addition of capacitors $C_P$ and $C_N$ coupled to ground. Absent the present invention, the impedance to ground connection on negative input line 16 causes a problem when an open circuit condition exists on the negative input line 16. With an open circuit on negative input line 16, the positive input $V_P$ on input line 14 will become a time varying signal. Ideally, the negative input $V_N$ will be maintained at about 0.45 Volts below, thereby causing the output of amplifier 18 to maintain a constant voltage of 2.025 Volts. Due to the presence of capacitor $C_N$, the negative terminal to the amplifier 18 will not track the positive input instantaneously. This in turn may cause the output $V_{OUT}$ to fluctuate and, as a consequence, further processing may not properly distinguish that an open circuit condition exists.

A similar condition occurs when the positive input line 14 has an open-circuit condition associated therewith. However, the negative input $V_N$ on input line 16 becomes a DC ground reference which exhibits minimal noise after filtering. Therefore, the positive input $V_P$ on input line 14 will maintain a constant 0.45 Volts above the negative input $V_N$ on input line 16, and the output $V_{out}$ should be maintained at the desired 2.025 Volts.

The introduction of series resistors $R_P$ and $R_N$ further introduces a gain attenuation problem into the interface circuit 50. This is because the addition of series resistors $R_P$ and $R_N$ work against a given internal impedance which, according to the example described herein, is approximately 1.2 MΩ. The external impedance provided by resistors $R_P$ and $R_N$ reduces the differential voltage to the amplifier 18 thereby causing the output voltage $V_{OUT}$ to be incorrect. Given a source impedance of 8 KΩ, the output voltage $V_{OUT}$ may exhibit an error of approximately 15 mV. This is too great of a systematic error for such modern and future engine and powertrain control module applications.

To account for an open circuit condition on the negative input line 16, a current source $I_{CS}$ has been added to the negative input line 16A to supply a pullup current. In addition, a voltage comparator 52 is provided which has a non-inverting (+) input coupled to the negative input line 16 via resistor $R_N$ and an inverting (−) input coupled to a reference input 54 for receiving a voltage reference $V_{REF}$. Voltage reference $V_{REF2}$ should be greater than the common mode range of the input, which is 2.0 volts according to one example, and is preferably set equal to about 2.8 volts for a particular example. Voltage comparator 52 has an output coupled to an analog switch 56 for controlling the contact portion of switch 56. The analog switch 56 switches between a first position (#1) which is connected to a 2.025 Volt source and a second position (#2) which is connected to the output of amplifier 18. In turn, the analog switch provides connection to output 20.

The inclusion of the current pullup $I_{CS}$ and switching circuitry 56 along with comparator 52 compensates for problems introduced by way of the RC filter networks coupled to input lines 14 and 16 and further helps ensure continued operation when either of input lines 14 and 16 undergoes an open-circuit condition. However, the addition of these features causes a voltage offset to occur at the output voltage $V_{OUT}$ due to the series resistor $R_N$ source impedance and current pullup.

The minimum amount of current provided by current source $I_{CS}$ is set by the requirement to pull the voltage potential across resistor $R_1$ above reference voltage $V_{REF2}$ at a minimum common mode voltage of −2.0 Volts, for example. In practice, this alone could establish a constant voltage offset at the output which could cause an excessive error. The interface circuit 50 of the present invention advantageously accounts for the systematic error of the current source $I_{CS}$ and the input resistance that is added to the system.

The interface circuit 50 of the present invention compensates for changes in gain and offset introduced by the external input impedances presented by the input filtering. The necessary compensation will be described in accordance with a preferred embodiment according to the following example. Given a resistor $R_N$ with a resistance of about 1 KΩ, $R_1$ set equal to about 1.2 MΩ, a voltage supply $V_S$ with initial requirements of approximately 450 mV and a current source $I_{CS}$ of approximately 5 µA. According to the above example, the current source $I_{CS}$ of 5 µA assures that if the negative input 16 is open and the positive input 14 is at approximately −2 Volts, the voltage potential developed across the resistor $R_1$ is greater than the reference voltage $V_{REF2}$ and the desired 2.025 Volts is established at the output 20. Therefore, the input to the gain stage has approximately a positive 5 mV offset.

To compensate for the additional input voltage, the voltage source is reduced by 5 mV to a value of 0.445 Volts. Further, the gain of amplifier 18 must be increased to about 4.55 so as to amplify the 0.445 Volts to the desired output of 2.025 Volts. Finally, because the closed circuit gain has been increased, the external resistance must be increased to reduce the overall system gain. The input impedance is calculated according to the following equation:

$$\frac{R_1}{R_1 + (R_N + R_P)} \times \text{Gain} = \text{Desired Gain}$$

The total series resistance $(R_N + R_P)$ according to the illustrated example calculates to 13.4 kΩ. Because $R_N$ is set equal to 1 KΩ and is in a series with the negative terminal 16, a resistance of 12.4 kΩ must be in series with the positive terminal and, accordingly, $R_P$ is set equal to 12.4 kΩ. It should be appreciated that while the compensation provided by the present invention is provided with regard to a specific example, different values for the current source $I_{CS}$, voltage supply $V_S$ and resistor values will result in different gain, voltage offset and resistance. Accordingly, the amount of compensation provided by the present invention can be modified to meet the needs of a given system.

With particular reference to FIG. 3, a detailed illustration of the oxygen sensor interface circuit 50 is shown implemented in a preferred switched capacitor circuit arrangement according to the present invention. The present invention employs a switched capacitor integrated circuit (IC) topology in a manner which provides for a desired transfer response, yet allows for a simplified amplification arrangement. The input terminal 14 which receives the voltage $V_P$ is connected to a switch 22. Likewise, input terminal 16 for receiving voltage $V_N$ is connected to a switch 26. Switches 22 and 26 in turn are coupled together at a common node 38. Accordingly, the voltage potential applied across input terminals 14 and 16 are combined to provide a time varying signal which alternates between voltages $V_P$ and $V_N$.

The interface circuit 50 according to the switched capacitor circuit arrangement further includes a first capacitor $C_1$. Capacitor $C_1$ connected at a first end to node 38 coupled in parallel with input terminals 14 and 16. Capacitor $C_1$ is further connected at a second end to an IC chip supply voltage $V_{CC}$ via a switch 24. The second end of capacitor $C_1$ is further coupled to ground via another switch 28.

The interface circuit 50 of FIG. 3 further has an operational amplifier (op amp) 40 with non-inverting (+) and inverting (−) inputs. A second capacitor $C_2$ is connected to node 38. The inverting input (−) of the operational amplifier 40 is connected to second capacitor $C_2$ via line 44 and a switch 30. Operational amplifier 40 is configured to provide a fixed gain. Operational amplifier 40 therefore produces an amplified output voltage $V_{OUT}$ which is supplied to output 20 via analog switch 56. A third capacitor $C_3$ is connected to the second capacitor $C_2$ and in parallel with the operational amplifier 40. A switch 34 is connected in series between the third capacitor $C_3$ and the output terminal 20. In addition, a grounded switch 32 is connected at one end between capacitor $C_3$ and switch 34 and at the other end to ground.

In accordance with the present invention, the operational amplifier 40 as described herein has a reference voltage $V_{REF}$ supplied to the non-inverting input (+) of operational amplifier 40. The reference voltage $V_{REF}$ is a positive non-zero voltage signal with an amplitude that is within the input common mode voltage range of the operational amplifier 40.

The switched capacitor arrangement of interface circuit 50 further has a fourth capacitor $C_4$ connected to line 44 in parallel across the inverting input (−) and output of operational amplifier 40. Capacitor $C_4$ is a first order low pass filter which allows for the realization of a frequency response of about 0 to 350 Hz, according to one example. In addition, a switch 36 is connected between the non-inverting input (+) of the operational amplifier 40 and second capacitor $C_2$.

As previously mentioned, the oxygen sensor interface circuit 50 according to the present invention employs a switched capacitor topology which includes switches 22, 24, 26, 28, 30, 32, 34 and 36. Each of these switches are three terminal devices which include an input for providing a predetermined clocking signal. As shown, switches 22, 24, 32 and 36 each simultaneously receive a first clocking signal $\phi_1$. Switches 26, 28, 30 and 34 each simultaneously receive a second clocking signal $\phi_2$. According to the preferred embodiment, clocking signals $\phi_1$ and $\phi_2$ may each have a sampling rate of 100 kHz and are applied one at a time to achieve a proper two-phase switching operation which should be readily understandable to one in the art.

The switched capacitor interface circuit 10 shown in FIG. 3 minimizes amplifier requirements and can be realized cost-effectively with limited or no component adjustments. By injecting the two-phase clocking of signals $\phi_1$ and $\phi_2$, the switched capacitor topology is able to realize proper resistance characteristics with high accuracy. In addition to avoiding time consuming adjustments, the switched capacitor topology may also minimize the cost of the interface circuit 10. In doing so, the gain and input referred voltage are both a function of capacitor ratios. It is generally known that the impedance of a switched capacitor circuit is equal to $1/Cf_S$, where $f_S$ is the sampling rate (i.e., frequency of signals $\phi_1$ and $\phi_2$).

An on-chip oscillator (not shown) with a free running frequency proportional to 1/C is generally used so the input impedance becomes only a function of the resistor in the oscillator. If the resistor is an accurate external device, the input impedance of the circuit should be maintained regardless of process and temperature variations.

Since the actual sampling rate is inversely proportional to input capacitance, the input impedance will be constant as the capacitance varies. While the absolute value of the capacitors will vary, the circuit gain and open circuit voltages are a function of capacitor ratios. These ratios generally do not change with process and temperature. This keeps the gain and input referred voltage constant, thereby avoiding the need for circuit adjustments. With the two-phase clocking applied, a high clocking pulse in a given switch will provide the sampling frequency $f_S$ thereto and allow for the charging of capacitors associated along a given path. The transfer response achieved with circuit 50 is as follows:

$$\frac{V_{OUT}}{V_P - V_N} = \frac{C_2}{C_3 + (1 - Z^{-1})C_4} +$$

$$\frac{V_{OFF}}{(V_P - V_N)} \times \frac{C_2 + C_3}{C_3 + (1 - Z^{-1})C_4} +$$

$$\left( \frac{V_{cc} \times C_1}{C_1 + C_2} \right) \times \left( \frac{C_2}{C_3 + (1 - Z^{-1})C_4} \right)$$

where $V_{OFF}$ represents voltage offset inherent in amplifier 40 and $Z^{-1}$ represents a one clock cycle delay. The voltage offset $V_{OFF}$ is preferably minimized by optimizing the design of the operational amplifier 40. This is accomplished by connecting the non-inverting input (+) of operational amplifier 40 to the voltage reference $V_{REF}$ which allows for the design of an operational amplifier 40 that can realize a low voltage offset $V_{OFF}$.

The overall amplification gain provided by operational amplifier 40 is determined by the ratio of capacitor $C_2$ divided by capacitor $C_3$. In accordance with the example described in connection with the present invention, capacitor $C_2$ has a capacitance of 7.583 pF while capacitor $C_3$ has a capacitance of 1.685 pF. Given the frequency sampling rate of 100 kHz for clocking signals $\phi_1$ and $\phi_2$, the amplifier realizes an overall gain equal to 4.55. The circuit configuration also determines an offset gain which is generally equal to the gain of the amplifier plus one. Accordingly, the offset gain according to the above example with the present invention equates to about 5.5. The total input capacitance is equal to $C_1 + C_2$ where, given $C_1$ equal to 0.75 pF, the total input capacitance is equal to 8.333 pF. This in turn equates to an input resistance $R_1$ of 1.2 Mohms given the frequency sampling rate of 100 kHz. As a consequence of the input resistance characteristics, the voltage source $V_S$ value is equal to supply voltage $V_{CC} \times [C_1 \div (C_1 + C_2)]$. Given five volts $V_{CC}$, this equates to a voltage source $V_S$ of 445 mV. The grounded switch 32 on $\phi_1$ of the clock applies Vref to capacitor $C_3$. On $\phi_2$ of the clock, the voltage Vref on capacitor $C_3$ is subtracted off the input charge $V_D(C_1 + C_2)$ thereby referencing $V_{out}$ to the ignition ground.

In operation, an oxygen sensor 12 is mounted within an exhaust system on an automobile generally for sensing oxygen for purposes of maintaining the proper air-to-fuel ratio. The present invention provides the sensor interface circuit 10 for receiving a pair of sensor outputs $V_P$ and $V_N$ from the oxygen sensor 12 and amplifying and conditioning the signal for use by a processing device. Voltage outputs $V_P$ and $V_N$ are received via the input terminals 14 and 16 and combined to provide a differential voltage $V_D$. The differential voltage $V_D$ is amplified and processed by the interface circuit 50 to provide an analog output $V_{OUT}$ at output terminal 20. The operation of the switched capacitor circuit is timed with a two-phase clocking scheme. This involves alternately applying first and second clocking signals $\phi_1$ and $\phi_2$ to charge and discharge the capacitors so as to provide a switched capacitor circuit operation. In so doing, the capacitors provide an accurate resistance that does not vary over temperature and process deviations as the capacitance changes over time.

In order to filter out unwanted noise which is commonly found in the surrounding environment of an oxygen sensor, the RF filtering networks are added to input terminals 14 and 16. As previously mentioned, each filtering network includes a resistor and a capacitor. Additionally, a current source $I_{CS}$ is added to the negative line 16 to supply a pullup current thereto for purposes of accounting for an open circuit condition on the negative input line 16. The addition of the RC filtering networks and the current source $I_{CS}$ causes a voltage offset and changes the overall gain of the interface circuit 50. According to the present invention, the proper circuit values are adjusted to compensate for the voltage offset and to compensate for input resistance to achieve the desired overall gain. This includes properly reducing the voltage supply $V_S$ value and increasing the gain of amplifier 18. Also, the resistive values for resistors $R_N$ and $R_P$ are properly selected so as to achieve the desired overall input resistance to the interface circuit 50.

The input differential signals are applied to terminals 14 and 16 and combined at node 38 to provide for a single differential voltage $V_D$ at the inverting input (−) of operational amplifier 40. Therefore, operational amplifier 40 receives as an input the differential voltage $V_D$. The non-inverting input (+) of differential amplifier 40 is supplied with a predetermined reference voltage $V_{REF}$. Reference voltage $V_{REF}$ is a positive non-zero voltage which is set within the input common mode range of operational amplifier 40.

The operational amplifier 40 amplifies the differential voltage $V_D$ by a fixed amplification gain. The output of operational amplifier 40 in turn is referenced to ground. Accordingly, the output voltage $V_{OUT}$ applied to output terminal 20 via analog switch 56 is referenced to a ground such as the ignition ground employed by the analog-to-digital converter 21. As a consequence, the interface circuit 50 advantageously achieves common mode rejection for a system that may be subjected to common mode voltage excursions, while at the same time providing for corrective voltage offset compensation and gain compensation.

The output voltage $V_{OUT}$ from operational amplifier 40 is applied to output terminal 20 when analog switch 56 is in contact position #2. Otherwise, the voltage output $V_{OUT}$ at output terminal 20 is pulled to a constant 2,025 volts with analog switch 56 in contact position #1. The selection of contact positions #1 or #2 for analog switch 56 is controlled by the output of comparator 52. This ensures that the interface circuit 50 operates properly despite the presence of an open-circuit condition on either of input lines 14 or 16.

Figure 4:
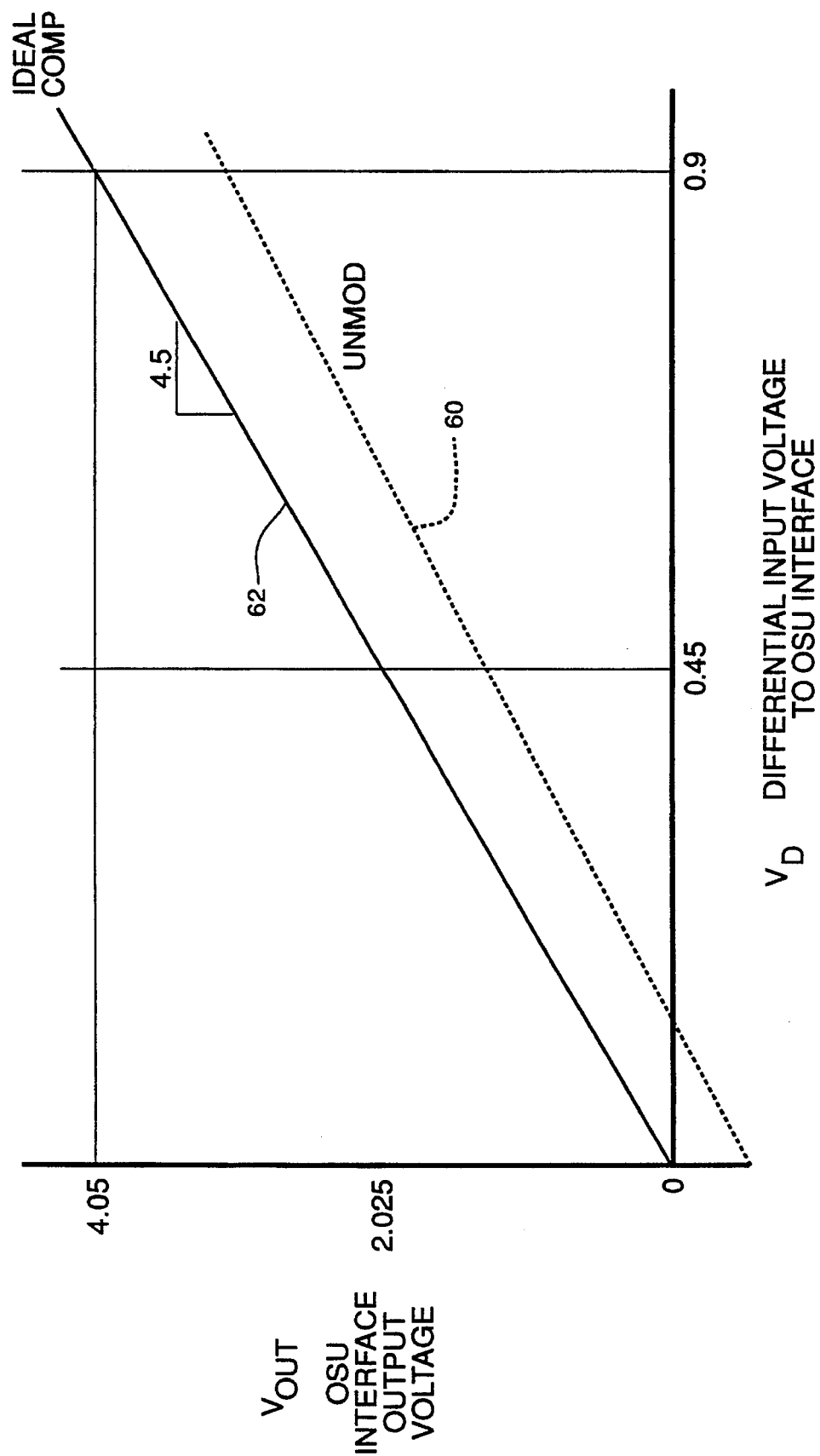
FIG. 4 is a graph which illustrates output voltage versus input voltage achieved both with and without the interface circuit according to the present invention.

An illustrative example of output voltage $V_O$ versus differential input voltage $V_O$ achieved with the oxygen sensor interface circuit 50 is provided in the graph shown in FIG. 4. The graph provides a comparative illustration of performance data achieved with the present invention in contrast to an unmodified circuit arrangement. The unmodified circuit arrangement curve 60 includes current source $I_{CS}$, but not the optimum circuit settings as provided by the present invention. As shown in the graph, the voltage offset is compensated for on the achieved curve 62, while at the same time achieving the desired transfer response. The voltage difference between the two curves 60 and 62 in FIG. 4 is 18.7 mV when the differential input voltage $V_D$ is 0.0 volts, and 24.9 mV when $V_D$ is 0.9 volts. Accordingly, the present invention may achieve a linear transfer function with has substantially little or no voltage offset and achieves the desired overall gain.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

The embodiments of the invention in which an exclusive property or privilege is claimed are defined as follows:

1. A sensor interface circuit for amplifying and processing sensor output signals, said circuit comprising:

first and second inputs for receiving an output signal from a sensor;

a first RC filter network coupled to the first input, said first RC filter network having a first resistor coupled in series to the first input and a first capacitor coupled between the first input and ground;

a second RC filter network coupled to the second input, said second RC filter network having a second resistor coupled in series to the second input and a second capacitor coupled between the second input and ground;

means for joining the first and second inputs so as to provide a differential voltage representative of a voltage potential between said first and second inputs;

an amplifier having a first input for receiving the differential voltage, and an output for providing an amplified output signal;

current source means for supplying a predetermined current to a selected one of said first and second RC filter networks;

voltage source means for supplying a voltage potential to the differential voltage, said voltage potential substantially compensating for any voltage offset introduced by said first and second RC filter networks;

comparator means for comparing a voltage potential on said selected one of said first and second inputs with a predetermined reference voltage and providing an output; and switch means coupled to an interface circuit output for selectively switching between the output of said amplifier and a predetermined voltage output in response to the comparator output.

2. The circuit as defined in claim 1 wherein the amplifier has a gain which is adjusted to further compensate for input resistance associated with the first and second RC filter networks so as to achieve a desired overall gain.

3. The circuit as defined in claim 1 wherein said sensor output signal includes a sensor ground which is received by said second input and a voltage potential referenced to said sensor ground and received by said first input.

4. The circuit as defined in claim 3 wherein said sensor output signal is output from a sensor grounded to an exhaust system on an automobile.

5. The circuit as defined in claim 4 wherein said sensor output signal is output from an oxygen sensor.

6. The circuit as defined in claim 1 including means for referencing the output of said amplifier to a reference ground so as to provide an analog output signal referenced to said reference ground.

7. An oxygen sensor interface circuit for interfacing oxygen sensor output signals with a processing device, said interface circuit comprising:

- a first input for receiving an output signal from the oxygen sensor;
- a second input for receiving a common mode ground utilized by the oxygen sensor;
- a first RC filter network coupled to the first input, said first RC filter network having a first resistor coupled in series to the first input and a first capacitor coupled between the first input and ground;
- a second RC filter network coupled to the second input, said second RC filter network having a second resistor coupled in series to the second input and a second capacitor coupled between the second input and ground;
- means for joining the first and second inputs to generate a differential voltage that is representative of a voltage potential between the first and second inputs;
- an amplifier with a gain and having an input for receiving the differential voltage, and an output for providing an amplified output signal;
- current source means for supplying a predetermined current to a selected one of said first and second RC filter networks;
- voltage source means for providing a voltage potential to the differential voltage;
- comparator means for comparing a voltage potential on the selected one of said first and second inputs with a predetermined reference voltage and providing an output; and
- switch means coupled to an interface circuit output for selectively switching between the output of said amplifier and a predetermined voltage output in response to the comparator output, and wherein the gain of said amplifier and the voltage potential provided by said voltage source means are adjusted to compensate for input resistance associated with the first and second RC filter networks so as to achieve a desired overall gain.

8. The circuit as defined in claim 7 wherein said voltage potential provided across the first and second inputs substantially compensates for any voltage offset caused by the first and second RC filter networks.

9. The circuit as defined in claim 7 wherein the amplifier output is coupled to a grounded switch for providing the reference to ground.

10. The circuit as defined in claim 7 wherein said circuit further comprises a plurality of capacitors and switches wherein said capacitors, said switches, and the rest of said elements in the circuit are arranged in a switched capacitor topology for responding to multiple phase clocking signals.

11. The circuit as defined in claim 7 wherein said sensor is mounted on an automobile and grounded separate from said reference ground.

12. In a sensor interface circuit having first and second inputs for receiving an output signal from a sensor, RF filtering circuitry coupled to said first and second inputs, means for joining the first and second inputs to provide a differential voltage representative of a voltage potential between the first and second inputs, an amplifier with a gain, an input for receiving the differential voltage and an output for providing an amplified output signal, a method for compensating for external input impedances caused by the addition of the RF filtering circuitry, said method comprising:

- supplying a predetermined current to the RC filtering circuitry coupled to a selected one of the first and second inputs;
- comparing a voltage potential on said selected one of the first and second inputs with a predetermined reference voltage;
- supplying a supply voltage to the differential voltage and setting the supply voltage so as to compensate for voltage offset caused by the RF filtering circuitry;
- selecting the amplifier gain so as to compensate for gain changes due to input resistance so as to achieve a desired overall gain; and
- selectively connecting the output of the interfacing circuit to the output of the amplifier or a predetermined voltage output in response to the comparison step.

* * * * *